United States Patent
Bezama et al.

(10) Patent No.: US 6,395,337 B1
(45) Date of Patent: May 28, 2002

(54) SUBSTRATE WITH CERAMIC COATING FOR CAMBER MODIFICATION AND METHOD FOR MAKING

(75) Inventors: Raschid J. Bezama, Mahopac; Govindarajan Natarajan, Pleasant Valley; Robert W. Pasco, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/364,845

(22) Filed: Jul. 30, 1999

(51) Int. Cl.$^7$ .............................. B05D 3/02; B05D 1/36

(52) U.S. Cl. .............................. 427/376.1; 427/126.2; 427/126.4; 427/376.2; 427/383.5; 427/419.2

(58) Field of Search .......................... 427/376.1, 126.2, 427/126.4, 376.2, 419.2, 383.5, 96, 126.1; 156/89, 289

(56) References Cited

U.S. PATENT DOCUMENTS

| | | | |
|---|---|---|---|
| 4,340,436 A | | 7/1982 | Dubetsky et al. |
| 5,034,260 A | | 7/1991 | Kumagai et al. |
| 5,474,741 A | * | 12/1995 | Mikeska et al. |
| 5,480,503 A | * | 1/1996 | Casey et al. |
| 5,601,672 A | * | 2/1997 | Casey et al. |
| 5,814,262 A | * | 9/1998 | Ketcham et al. |
| 5,846,361 A | * | 12/1998 | Fasano et al. |
| 5,870,823 A | * | 2/1999 | Bezama et al. |
| 5,874,162 A | | 2/1999 | Bastian et al. |
| 5,882,455 A | * | 3/1999 | Bezama et al. |
| 5,948,193 A | * | 9/1999 | Cohn et al. |
| 6,004,624 A | * | 12/1999 | Bates et al. |

* cited by examiner

Primary Examiner—Deborah Jones
Assistant Examiner—Jennifer McNeil
(74) Attorney, Agent, or Firm—Ira D. Blecker

(57) ABSTRACT

A multilayer ceramic substrate contains a ceramic coating which is different in composition than the main body of the multilayer ceramic substrate to control camber of the multilayer ceramic substrate during sintering. The primary component of the ceramic coating is a secondary component of the main body of the multilayer ceramic substrate.

21 Claims, 2 Drawing Sheets

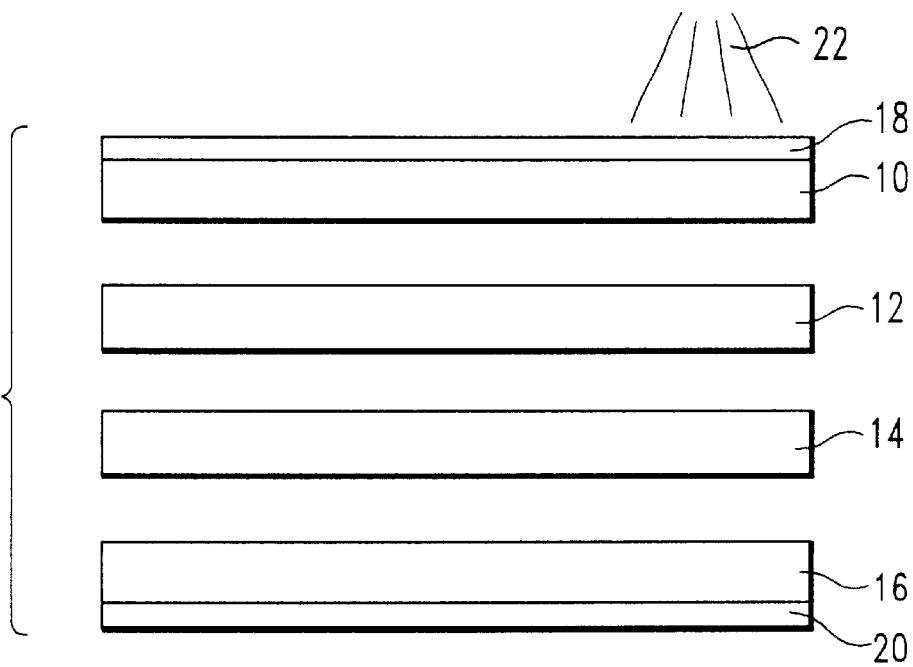
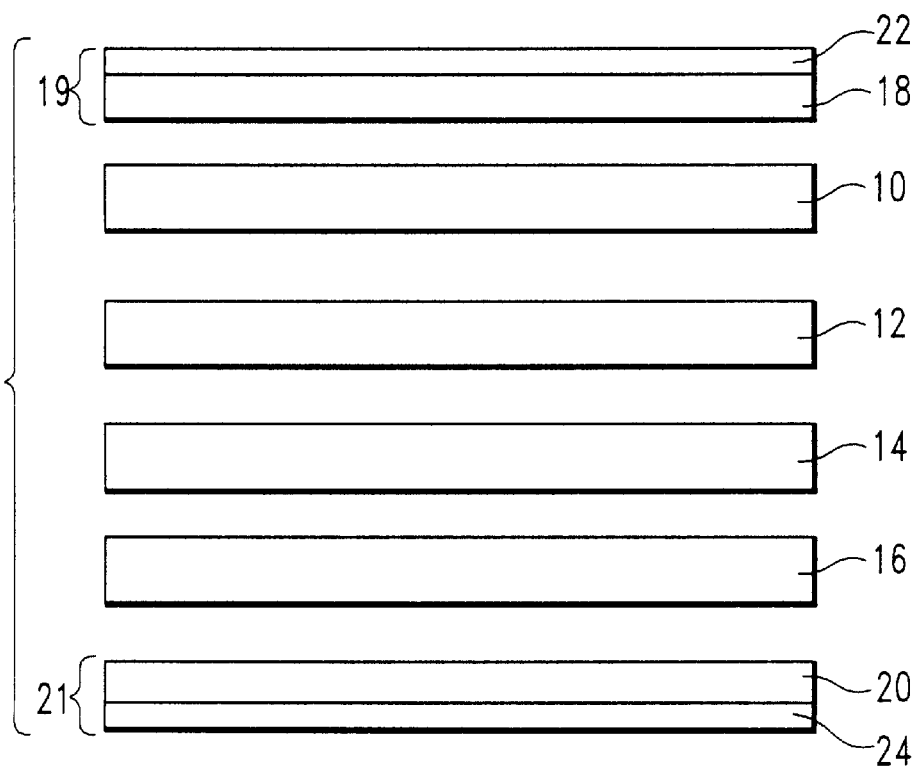

SUBSTRATE WITH CERAMIC COATING FOR CAMBER MODIFICATION AND METHOD FOR MAKING

BACKGROUND OF THE INVENTION

The present invention relates to the forming of multilayer ceramic laminated structures and, more particularly, to the forming of multilayer ceramic laminated structures having a ceramic coating thereon for camber modification during sintering.

Multilayer ceramic (MLC) structures are used in the production of electronic substrates and devices. The MLCs can have various layering configurations. For example, an MLC circuit substrate may comprise patterned metal layers which act as electrical conductors sandwiched between ceramic layers which act as a dielectric medium. For the purposes of interlayer interconnections, most of the ceramic layers have via holes, more typically called vias. Prior to lamination, the vias are typically filled with an electrically conductive paste, such as a metallic paste, and sintered to form vias which provide the electrical connection between the layers. In addition, the MLC substrates may have termination pads for attaching semiconductor chips, connector leads, capacitors, resistors, to name a few.

Generally, conventional ceramic structures are formed from ceramic greensheets which are prepared from a slurry of ceramic particulate, thermoplastic polymer binders, plasticizers, and solvents. This composition is spread or cast into ceramic sheets or slips from which the solvents are subsequently volatilized to provide coherent and self-supporting flexible greensheets. After via formation, metal paste screening, stacking and lamination, the greensheets are fired or sintered at temperatures sufficient to burn-off or remove the unwanted polymeric binder resin and sinter the ceramic particulate together into a densified ceramic substrate.

Camber is the slight curving of the MLC substrate so that it is not flat. MLC substrate camber occurring during sintering is generated by the difference in densification behavior between the ceramic powder and the substrate metallurgy, or by differences in the green density of the ceramic body after the lamination process. MLC substrates with camber some times can be reworked by a liquid-phase sintering process or, in the case of glass-based ceramic systems, by a flattening process but at additional processing cost. Moreover, the flattening process can generate defects on the substrate surfaces which translate into additional processing cost from inspection and yield losses. Hence, camber control prior to substrate post-sinter processing is desired.

Various solutions have been proposed to reduce camber.

Dubetsky et al. U.S. Pat. No. 4,340,436, the disclosure of which is incorporated by reference herein, discloses a two-step sintering process wherein the sintering process for a ceramic substrate is interrupted, a light weight placed on the ceramic substrate and then the sintering process is continued. The result is a flat ceramic substrate.

Bastian et al. U.S. Pat. No. 5,874,162, the disclosure of which is incorporated by reference herein, discloses a conformable load tile which is placed over the ceramic substrates. During the sintering process, the conformable load tile deforms to maintain flatness of the ceramic substrates.

The aforementioned solutions to the camber problem are mechanical in nature. It would be desirable to have a solution to the camber problem that is not mechanical in nature.

Generally speaking, it is known to apply coatings to ceramic substrates for various purposes. For example, Kumagai et al. U.S. Pat. No. 5,034,260, the disclosure of which is incorporated by reference herein, discloses the addition of a coating to a ceramic substrate for the purpose of insulating crystal grain boundaries.

It is a purpose of the present invention to have a method for controlling the camber of a ceramic substrate which is not mechanical in nature.

It is another purpose of the present invention to have a method for manufacturing a ceramic substrate with a coating which controls the camber of the ceramic substrate.

It is yet another purpose of the present invention to have a ceramic substrate with a coating which controls the camber of the ceramic substrate.

These and other purposes of the invention will become more apparent after considering the following description of the invention in conjunction with the accompanying Figures.

BRIEF SUMMARY OF THE INVENTION

A first aspect of the present invention relates to a method of forming a multilayer ceramic substrate with reduced camber, the method comprising the steps of:

forming a plurality of ceramic greensheets;

stacking and laminating the plurality of ceramic greensheets to form a stack with one of the plurality of ceramic greensheets being a first ceramic greensheet of the stack and one of the plurality of ceramic greensheets being a last ceramic greensheet of the stack;

forming a coating of ceramic material on at least one of the first and last ceramic greensheets of the stack;

sintering the stack of ceramic greensheets at a predetermined temperature to cause densification of the ceramic material in the ceramic greensheets;

wherein the coating of ceramic material on at least one of the first and last ceramic greensheets of the stack alleviates camber resulting from sintering.

A second aspect of the present invention relates to a method of forming a multilayer ceramic substrate with reduced camber, the method comprising the steps of:

forming a plurality of ceramic greensheets wherein the ceramic material of the ceramic greensheets primarily comprises alumina particles, glass ceramic particles or aluminum nitride particles;

applying a coating of ceramic material to at least one of the plurality of ceramic greensheets wherein the ceramic material of the coating is glass frit, grit, magnesium silicate, aluminum-magnesium silicate, aluminum-magnesium-silicon oxide, calcia-alumina-boria glass, or calcia-alumina-boria-yttria glass;

stacking and laminating the plurality of ceramic greensheets to form a stack;

sintering the stack of ceramic greensheets at a predetermined temperature to cause densification of the ceramic material in the ceramic greensheets;

wherein the coating of ceramic material on at least one of the plurality of ceramic greensheets alleviates camber resulting from sintering.

A third aspect of the present invention relates to a method of forming a multilayer ceramic substrate with reduced camber, the method comprising the steps of:

forming a plurality of ceramic greensheets wherein the ceramic material of the ceramic greensheets primarily comprises alumina particles, glass ceramic particles or aluminum nitride particles;

stacking and laminating the plurality of ceramic greensheets to form a stack with one of the plurality of ceramic greensheets being a first ceramic greensheet of the stack and one of the plurality of ceramic greensheets being a last ceramic greensheet of the stack;

applying a coating of ceramic material on at least one of the first and last ceramic greensheets of the stack, wherein the ceramic material of the coating is glass frit, grit, magnesium silicate, aluminum-magnesium silicate, aluminum-magnesium-silicon oxide, calcia-alumina-boria glass, or calcia-alumina-boria-yttria glass;

sintering the stack of ceramic greensheets at a predetermined temperature to cause densification of the ceramic material in the ceramic greensheets;

wherein the coating of ceramic material on at least one of the first and last ceramic greensheets of the stack alleviates camber resulting from sintering.

A fourth aspect of the present invention relates to a multilayer ceramic greensheet laminate comprising:

a plurality of ceramic greensheets stacked and laminated to form a ceramic greensheet laminate with one of the plurality of ceramic greensheets being a first ceramic greensheet of the stack and one of the plurality of ceramic greensheets being a last ceramic greensheet of the stack;

a coating of ceramic material on at least one of the first ceramic greensheet and the last ceramic greensheet.

A fifth aspect of the present invention relates to a multilayer ceramic substrate comprising;

a plurality of layers of ceramic material formed into a substrate, the substrate having a first surface and a second surface parallel to the first surface wherein the ceramic material of the substrate primarily comprises a first component and secondarily a second component; and at least one of the first and second surfaces being richer in the second component than in the interior of the substrate so as to form a compositional gradient at the at least one of the first and second surfaces;

wherein the first component is alumina particles, glass ceramic particles or aluminum nitride particles and the second component is glass frit, grit, magnesium silicate, aluminum-magnesium silicate, aluminum-magnesium-silicon oxide, calcia-alumina-boria glass, or calcia-alumina-boria-yttria glass.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIG. 1 is a schematical representation of a first embodiment of the present invention wherein a coating according to the present invention is sprayed on the greensheets prior to stacking and laminating.

FIG. 2 is a schematical representation of a second embodiment of the present invention wherein a coating according to the present invention is applied to a carrier sheet and then stacked and laminated with the remainder of the greensheets.

DETAILED DESCRIPTION OF THE INVENTION

Figure 3:
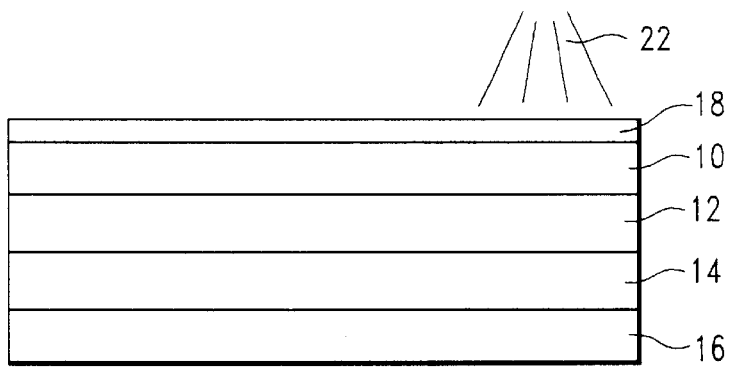
FIG. 3 is a schematical representation of a third embodiment of the present invention wherein a coating according to the present invention is sprayed on the greensheets after they have been stacked and laminated.

Referring to the drawings in more detail, and particularly referring to FIG. 1, there are shown a plurality of ceramic greensheets which, when stacked and laminated, would form a multilayer ceramic substrate laminate ready for sintering. Ceramic greensheet 10 is the top layer of the multilayer ceramic substrate laminate while the bottom layer is ceramic greensheet 16. As shown in FIG. 1, ceramic greensheet 10 has a ceramic coating 18 being formed thereon by conventional means, for example by spraying 22. Ceramic greensheets 12, 14 do not have any ceramic coating and are conventional in nature. Ceramic greensheet 16 has a ceramic coating 20 which has been previously sprayed on ceramic greensheet 16.

At this point, all of ceramic greensheets 10-16 would be stacked and laminated to form a multilayer ceramic substrate laminate. If desired, the multilayer ceramic substrate laminate would be sintered by conventional means to form a multilayer ceramic substrate.

It should be understood that while ceramic coating 18 is shown on ceramic greensheet 10 and ceramic coating 20 is shown on ceramic greensheet 16, in practice only ceramic coating 18 or 20 might be necessary. The skilled artisan would be able to determine which ceramic coating or coatings (18 or 20 or both 18 and 20) are necessary to achieve the objects of the present invention.

Referring now to FIG. 2, there is shown a second embodiment of the present invention. In this embodiment, ceramic greensheets 10–16 are initially formed without a ceramic coating. When ceramic greensheets 10–16 are stacked, composite sheets 19 and 21 are stacked as well. Composite sheet 19 consists of ceramic coating 18 which has been applied to carrier sheet 22. The composite sheet 19 is placed so that the ceramic coating 18 is in contact with ceramic greensheet 10. In a similar manner, composite sheet 21 consisting of carrier sheet 24 and ceramic coating 20 has been placed so as to be adjacent to ceramic greensheet 16.

The carrier sheet should be chosen so that it can be either removed easily before sintering or it pyrolyzes and burns off cleanly during the sintering of the multilayer ceramic substrate. The present inventors have found that a MYLAR (MYLAR, a polyester material, is a trademark of DuPont) carrier sheet works well in practice. As noted above, it is anticipated that ceramic coating or coatings 18 or 20 or both 18 and 20 may be used, depending on the situation.

A third embodiment of the invention is shown in FIG. 3. Ceramic greensheets 10–16 have been stacked and laminated as is conventional in the art. In this embodiment, however, ceramic coating 18 is formed, preferably by spraying 22, on ceramic greensheet 10. After ceramic coating 18 has been formed, the stack of ceramic greensheets 10–16 would be flipped over and ceramic coating 20 would be formed on ceramic greensheet 16 if desired. It is anticipated that ceramic coating or coatings 18 or 20 or both 18 and 20 may be used, depending on the situation.

Figure 4:
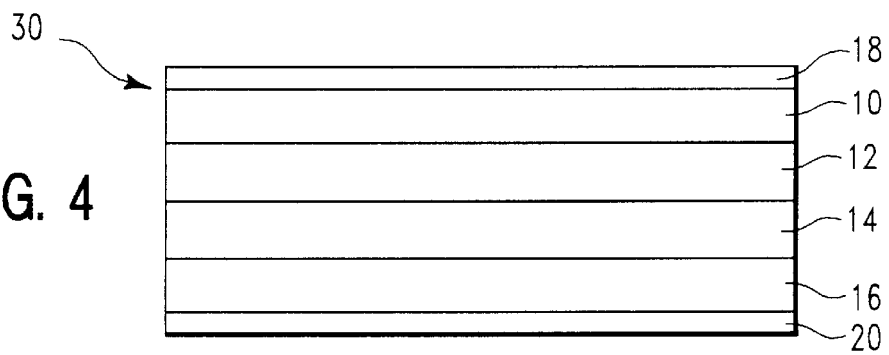
FIG. 4 is a cross sectional view of a multilayer ceramic substrate according to the present invention prior to sintering showing the coating.

As shown in FIG. 4, there is a multilayer ceramic greensheet laminate 30 comprising a plurality of ceramic greensheets 10–16 having ceramic coatings 18, 20. Ceramic coatings 18, 20 could have been formed in any of the methods previously discussed. Again, it is anticipated that ceramic coating or coatings 18 or 20 or both 18 and 20 may be used on the multilayer ceramic substrate laminate 30, depending on the situation.

Figure 5:
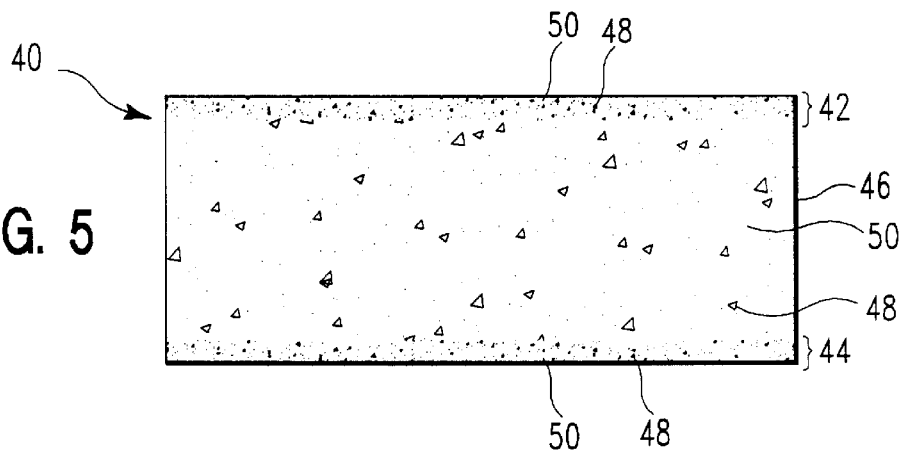
FIG. 5 is a cross sectional view of a multilayer ceramic substrate according to the present invention after sintering showing the compositional gradient resulting from the coating.

After the multilayer ceramic substrate laminate 30 is sintered according to conventional practice, a multilayer ceramic substrate 40 is formed as illustrated in FIG. 5. As a result of the ceramic coatings 18, 20 that are formed on the multilayer ceramic substrate laminate 30 in FIG. 4, the multilayer ceramic substrate 40 shown in FIG. 5 has a compositional gradient formed on the surfaces of the multilayer ceramic substrate 40. That is, the interior 46 of the multilayer ceramic substrate 40 comprises at least a first component 50 and a second component 48. First component 50 is the primary component while second component 48 is the secondary component. By primary component, it is meant that the primary component makes up most or the majority of the volume of the multilayer ceramic substrate 40 while the second component is added to the multilayer ceramic substrate 40 in amounts less than the primary component. However, the surfaces 42, 44 of the multilayer ceramic substrate 40 are richer in the second component 48 than in the interior 46 of the multilayer ceramic substrate 40. Conversely, the surfaces 42, 44 of the multilayer ceramic substrate 40 are poorer in the first component 50 than in the interior of the multilayer ceramic substrate 40. The result is that a compositional gradient is formed from the surfaces 42, 44 inwardly toward the interior of the multilayer ceramic substrate 40. Of course, if only ceramic coating 18 or 20 were utilized in the multilayer ceramic substrate laminate 30, then the multilayer ceramic substrate 40 would contain a compositional gradient only at surface 42 or 44.

Figure 6:
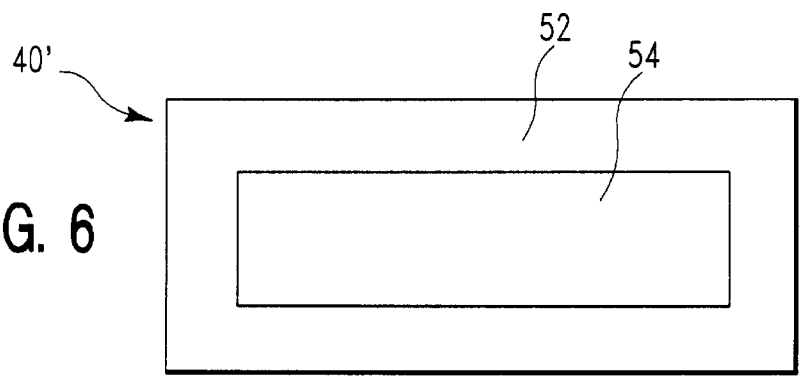
FIG. 6 is a top view of the multilayer ceramic substrate according to the present invention showing the coating covering only a portion of the surface of the substrate.

The ceramic coating may be over the entire surface of the multilayer ceramic substrate or only over part of it. For example, as shown in FIG. 6, ceramic coating 52 on multilayer ceramic substrate 40' covers only part of the surface of the multilayer ceramic substrate 40'. Surface portion 54 of multilayer ceramic substrate 40' contains no ceramic coating. As the skilled artisan will appreciate, the coverage of the ceramic coating can be adjusted to fit the amount of camber that needs to be corrected.

In the embodiments discussed above, four ceramic greensheets were shown as making up the multilayer ceramic substrate laminate 30 and multilayer ceramic substrate 40. It can be appreciated that the number of ceramic greensheets is a matter of design and is otherwise unimportant to the present invention. Accordingly, the number of ceramic greensheets illustrated is meant to be for purposes of illustration and not limitation.

The materials that comprise the ceramic coating and the ceramic of the ceramic greensheet are varied. It is preferred that the primary component of the ceramic greensheet and the multilayer ceramic substrate be alumina, glass ceramic or aluminum nitride. It is preferred that the ceramic that makes up the ceramic coating be primarily glass frit, grit, magnesium silicate, aluminum-magnesium silicate, aluminum-magnesium-silicon oxide, calcia-alumina-boria glass, or calcia-alumina-boria-yttria glass. Glass frit is simply pulverized glass particles. Grit is pulverized crystallized ceramic particles and may be, for example, alumina, zirconia, glass ceramic, aluminum nitride, silicon nitride, silicon carbide, etc.

More preferably, the above ceramic materials should be used in the following combinations. When the primary component of the ceramic greensheet and the multilayer ceramic substrate is alumina, the ceramic coating should primarily consist of frit and/or grit. When the primary component of the ceramic greensheet and the multilayer ceramic substrate is glass ceramic, the ceramic coating should primarily consist of magnesium silicate, aluminum-magnesium silicate, or aluminum-magnesium-silicon oxide. Lastly, when the primary component of the ceramic greensheet and the multilayer ceramic substrate is aluminum nitride, the ceramic coating should primarily consist of calcia-alumina-boria glass or calcia-alumina-boria-yttria glass.

It is preferred that the particle size of the ceramic particles in the ceramic coating (prior to sintering) is approximately $1\mu$ or less, and preferably $0.1\mu$—$0.01\mu$.

While not wishing to be held to any particular theory, it is believed that the present invention works to control camber by controlling densification of the multilayer ceramic substrate.

Assume a multilayer ceramic substrate laminate wherein the primary component is alumina and there are secondary components of glass frit and grit (crystallized alumina). Densification behavior of the alumina ceramic phase is a function of the behavior and composition of the ceramic liquid phase present. The liquid phase is generated by melting the glass frit which is uniformly distributed throughout the multilayer ceramic substrate laminate. A thin film, preferably less than 1 mil in thickness, of ceramic coating that will dissolve in the liquid phase is formed on the multilayer ceramic substrate laminate. By dissolving into the liquid phase, the thin film of ceramic coating generates a smooth composition gradient at the substrate surfaces or surfaces instead of the abrupt changes generated when a material of different composition is used to replace the first and/or last layers of the multilayer ceramic substrate laminate. While the thin film of ceramic coating does dissolve into the liquid phase, it should be understood that prior to this event, the ceramic coating will appear as a distinct thin layer. If the camber of the sintered multilayer ceramic substrate is caused by too much flow of the liquid phase, the ceramic coating would comprise primarily grit to decrease the flow of the liquid phase at the surface or surfaces of the multilayer ceramic substrate. On the other hand, if the camber of the sintered multilayer ceramic substrate is caused by too little flow of the liquid phase, the ceramic coating would primarily comprise glass frit to increase the flow of the liquid phase at the surface or surfaces of the multilayer ceramic substrate.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming a multilayer ceramic substrate with reduced camber, the method comprising the steps of:

formin a plurality of ceramic greensheets;

stacking and laminating the plurality of ceramic greensheets to form a stack having a top exterior surface and a bottom exterior surface with one of the plurality of ceramic greensheets being a first ceramic greensheet of the stack and having the top exterior surface and one of the plurality of ceramic greensheets being a last ceramic greensheet of the stack and having the bottom exterior surface;

forming a coating of ceramic material on at least one of the top and bottom exterior surfaces of the first and last ceramic greensheets of the stack;

sintering the stack of ceramic greensheets at a predetermined temperature to cause densification of the ceramic material in the ceramic greensheets and the coating of ceramic material, the sintered coating consisting of ceramic material adhered to the ceramic material from the ceramic greensheets;

wherein the coating of ceramic material on at least one of the top and bottom exterior surfaces of the first and last ceramic greensheets of the stack alleviates camber resulting from sintering.

2. The method of claim 1 wherein the ceramic material coating is applied to at least one of the first and last ceramic greensheets of the stack prior to the step of stacking and laminating.

3. The method of claim 2 wherein the step of forming a coating of ceramic material comprises applying the coating of ceramic material to at least one carrier sheet and then stacking and laminating the carrier sheet adjacent to at least one of the first and last ceramic greensheets in the step of stacking and laminating.

4. The method of claim 2 wherein the ceramic material coating is applied to at least one of the first and last ceramic greensheets of the stack subsequent to the step of stacking and laminating.

5. The method of claim 2 wherein the step of forming a coating of ceramic material comprises spraying at least one of the first and last ceramic greensheets of the stack with a ceramic material.

6. The method of claim 1 wherein the step of forming a coating of ceramic material comprises spraying at least one of the first and last ceramic greensheets of the stack with a ceramic material.

7. The method of claim 1 wherein the coating of ceramic material is formed on both of the first and last ceramic greensheets.

8. The method of claim 1 wherein in the step of forming a coating of ceramic material, the coating of ceramic material covers the entire ceramic greensheet.

9. The method of claim 1 wherein in the step of forming a coating of ceramic material, the coating of ceramic material only partially covers the ceramic greensheet.

10. The method of claim 1 wherein the ceramic material of the plurality of ceramic greensheets comprises primarily alumina particles and the ceramic coating material is glass frit or grit.

11. The method of claim 1 wherein the ceramic material of the plurality of ceramic greensheets comprises primarily glass ceramic particles and the ceramic coating material is a magnesium silicate, aluminum-magnesium silicate, aluminum-magnesium-silicon oxide or alumina.

12. The method of claim 1 wherein the ceramic material of the plurality of ceramic greensheets comprises primarily aluminum nitride particles and the ceramic coating material is a calcia- alumina-boria glass or a calcia-alumina-boria-yttria glass.

13. The method of claim 1 wherein the thickness of the coating of ceramic material, prior to sintering, is less than 1 mil.

14. The method of claim 1 wherein the plurality of ceramic greensheets, prior to stacking and laminating, are punched and screened with an electrically conductive paste.

15. The method of claim 1 wherein the particle size of the ceramic material in the coating is $1\mu$ or less.

16. The method of claim 15 wherein the particle size is $0.1\mu$ to $0.01\mu$.

17. A method of forming a multilayer ceramic substrate with reduced camber, the method comprising the steps of:

forming a plurality of ceramic greensheets wherein the ceramic material of the ceramic greensheets primarily comprises alumina particles, glass ceramic particles or aluminum nitride particles;

applying a coating of ceramic material to at least one of the plurality of ceramic greensheets wherein the ceramic material of the coating is glass frit, grit, magnesium silicate, aluminum-magnesium silicate, aluminum-magnesium-silicon oxide, calcia-alumina-boria glass, or calcia-alumina-boriayttria glass;

stacking and laminating the plurality of ceramic greensheets to form a stack having a top exterior surface and a bottom exterior surface, the coating of ceramic material being on at least one of the top and bottom exterior surfaces;

sintering the stack of ceramic greensheets at a predetermined temperature to cause densification of the ceramic material in the ceramic greensheets and the coating of ceramic material, the sintered coating consisting of ceramic material adhered to the ceramic material from the ceramic greensheets;

wherein the coating of ceramic material on at least one of the top and bottom exterior surfaces alleviates camber resulting from sintering.

18. The method of claim 17 wherein the step of applying the coating of ceramic material comprises spraying the coating of ceramic material on at least one of the plurality of ceramic greensheets.

19. The method of claim 17 wherein the step of applying the coating of ceramic material comprises applying the coating of ceramic material to at least one carrier sheet and then stacking and laminating the carrier sheet adjacent to at least one of the plurality of ceramic greensheets in the step of stacking and laminating.

20. A method of forming a multilayer ceramic substrate with reduced camber, the method comprising the steps of:

forming a plurality of ceramic greensheets wherein the ceramic material of the ceramic greensheets primarily comprises alumina particles, glass ceramic particles or aluminum nitride particles;

stacking and laminating the plurality of ceramic greensheets to form a stack having a top exterior surface and a bottom exterior surface with one of the plurality of ceramic greensheets being a first ceramic greensheet of the stack and having the top exterior surface and one of the plurality of ceramic greensheets being a last ceramic greensheet of the stack and having the bottom exterior surface;

applying a coating of ceramic material on at least one top and bottom exterior surfaces of the first and last ceramic greensheets of the stack, wherein the ceramic material of the coating is glass frit, grit, magnesium silicate, aluminum-magnesium silicate, aluminum-magnesium-silicon oxide, calcia-alumina-boria glass, or calcia-alumina-boria-yttria glass;

sintering the stack of ceramic greensheets at a predetermined temperature to cause densification of the ceramic material in the ceramic greensheets and the coating of ceramic material, the sintered coating consisting of ceramic material adhered to the ceramic material from the ceramic greensheets;

wherein the coating of ceramic material on at least one of the top and bottom exterior surfaces of the first and last ceramic greensheets of the stack alleviates camber resulting from sintering.

21. The method of claim 20 wherein the step of applying the coating of ceramic material comprises spraying the coating of ceramic material on at least one of the first and last ceramic greensheets.

* * * * *